US 6,690,040 B2

(12) United States Patent
Chaudhry et al.

(10) Patent No.: US 6,690,040 B2
(45) Date of Patent: Feb. 10, 2004

(54) VERTICAL REPLACEMENT-GATE JUNCTION FIELD-EFFECT TRANSISTOR

(75) Inventors: Samir Chaudhry, Orlando, FL (US); Paul Arthur Layman, Orlando, FL (US); John Russell McMacken, Orlando, FL (US); Ross Thomson, Clermont, FL (US); Jack Qingsheng Zhao, Orlando, FL (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/950,384

(22) Filed: Sep. 10, 2001

(65) Prior Publication Data

US 2003/0047749 A1 Mar. 13, 2003

(51) Int. Cl.[7] .......................... H01L 29/32; H01L 29/74; H01L 31/111; H01L 29/423; H01L 31/0328; H01L 31/0336; H01L 31/072; H01L 31/109; H01L 29/73; H01L 29/80; H01L 31/112; H01L 29/76; H01L 29/94; H01L 31/062; H01L 31/113; H01L 31/119

(52) U.S. Cl. ...................... 257/135; 257/107; 257/133; 257/192; 257/204; 257/256; 257/260; 257/263; 257/272; 257/281; 257/288

(58) Field of Search ................................. 257/107, 133, 257/134, 135, 136, 146, 155, 192, 204, 205, 206, 256, 260, 279, 280, 281, 288, 263, 272; 438/268, 270

(56) References Cited

U.S. PATENT DOCUMENTS

| | | |
|---|---|---|
| 4,366,495 A | 12/1982 | Goodman et al. |
| 4,455,565 A | 6/1984 | Goodman et al. |
| 4,587,713 A | 5/1986 | Goodman et al. |
| 4,683,643 A | 8/1987 | Nakajima et al. |
| 4,786,953 A | 11/1988 | Morie et al. |
| 4,837,606 A | 6/1989 | Goodman et al. |
| 5,342,797 A | 8/1994 | Sapp et al. |
| 5,367,184 A | 11/1994 | Chantre |
| 5,414,289 A * | 5/1995 | Fitch et al. .................. 257/329 |
| 5,576,238 A | 11/1996 | Fu |
| 5,599,724 A | 2/1997 | Yoshida |
| 5,668,391 A | 9/1997 | Kim et al. |
| 5,744,846 A | 4/1998 | Batra et al. |
| 5,866,925 A * | 2/1999 | Zolper et al. ................ 257/279 |
| 5,889,298 A * | 3/1999 | Plumton et al. ............ 257/263 |
| 6,027,975 A * | 2/2000 | Hergenrother et al. ...... 438/268 |
| 6,072,216 A | 6/2000 | Williams et al. |
| 6,133,099 A | 10/2000 | Sawada |
| 6,197,641 B1 | 3/2001 | Hergenrother et al. |
| 6,297,531 B2 | 10/2001 | Armacost et al. |

FOREIGN PATENT DOCUMENTS

EP    0 860 884 A2    8/1998

OTHER PUBLICATIONS

Dudek, et al, "Lithography–Independent Nanometer Silicon MOSFET's on Insulator", IEEE Transactions on Electron Devices, vol. 43, No. 10, Oct. 1996, pp. 1626–1631.
Risch, et al, "Vertical MOS Transistors with 70 nm Channel Length", IEEE Transactions on Electron Devices, vol. 43, No. 9, Sep. 1996, pp. 1495–1498.

(List continued on next page.)

Primary Examiner—Nathan J. Flynn
Assistant Examiner—Victor A. Mandala, Jr.
(74) Attorney, Agent, or Firm—John L. DeAngelis, Jr.; Beusse Brownlee Wolter Mora & Maire, P.A.

(57) ABSTRACT

A vertical JFET architecture. Generally, an integrated circuit structure includes a semiconductor area with a major surface formed along a plane and a first source/drain doped region formed in the surface. A second doped region forming a channel of different conductivity type than the first region is disposed over the first region. A third doped region is formed over the second doped region having an opposite conductivity type with respect to the second doped region, and forming a source/drain region. A gate is formed over the channel to form a vertical JFET.

21 Claims, 8 Drawing Sheets

OTHER PUBLICATIONS

Takato, et al, "Impact of Surrounding Gate Transistor (SGT) for Ultra–High–Density LSI's", IEEE Transactions on Electron Devices, vol. 38, No. 3, Mar. 1991, pp. 573–577.

Takato, et al, "High Performance CMOS Surrounding Gate Transistor (SGT) for Ultra High Density LSIs", IEDM 1988, pp. 222–225.

Hergenrother, et al, "The Vertical Replacement–Gate (VRG) MOSFET: A 50–nm Vertical MOSFET with Lithography–Independent Gate Length", Technical Digest of IEDM, 1999, pp. 75–78.

Oh, et al, "50 nm Vertical Replacement–Gate (VRG) pMOSFETs", IEEE 2000.

Hergenrother, et al, "The Vertical Replacement–Gate (VRG) MOSFET: A High–Performance Vertical MOSFET with Lithography–Independent Critical Dimensions", no publication information apparent from document.

Monroe, et al, "The Vertical, Replacement–Gate (VRG) Process for Scalable, General–purpose Complementary Logic", Paper 7.5, pp. 1–7, date and publication information unknown.

* cited by examiner

VERTICAL REPLACEMENT-GATE JUNCTION FIELD-EFFECT TRANSISTOR

FIELD OF THE INVENTION

The present invention is directed to semiconductor devices incorporating junctions of varying conductivity types and methods of making such devices. More specifically, the present invention is directed to vertical replacement-gate (VRG) junction field-effect transistor devices and methods for fabricating integrated circuits incorporating such devices.

BACKGROUND OF THE INVENTION

Enhancing semiconductor device performance and increasing device density (the number of devices per unit area), continue to be important objectives of the semiconductor industry. Device density is increased by making individual devices smaller and packing devices more compactly. But, as the device dimensions (also referred to as the feature size or design rules) decrease, the methods for forming devices and their constituent elements must be adapted. For instance, production device sizes are currently in the range of 0.25 microns to 0.12 microns, with an inexorable trend toward smaller dimensions. However, as the device dimensions shrink, certain manufacturing limitations arise, especially with respect to the lithographic processes. In fact, current lithographic processes are nearing the point where they are unable to accurately manufacture devices at the required minimal sizes demanded by today's device users.

Currently most metal-oxide-semiconductor field effect transistors (MOSFETs) are formed in a lateral configuration, with the current flowing parallel to the major plane of the substrate or body surface. As the size of these MOSFET devices decreases to achieve increased device density, the fabrication process becomes increasingly difficult. In particular, the lithographic process for creating the gate channel is problematic, as the wavelength of the radiation used to delineate an image in the lithographic pattern approaches the device dimensions. Therefore, for lateral MOSFETs, the gate length is approaching the point where it cannot be precisely controlled through the lithographic techniques.

Like MOSFETs, junction field-effect transistors (JFETs) have been formed using lithographically defined channel lengths. As the channel length decreases to increase device density, the channel length may not be controllable using conventional photolithographic techniques. Instead, expensive x-ray and electron beam lithographic equipment may be required for the formation of both MOSFETs and JFETs with state-of-the-art channel lengths.

Generally, integrated circuits comprise a plurality of active devices, including MOSFETs, JFETs and bipolar junction transistors, as well as passive components such as resistors and capacitors. Commonly owned U.S. Pat. Nos. 6,027,975 and 6,197,441, which are hereby incorporated by reference, teach certain techniques for the fabrication of vertical replacement gate (VRG) MOSFETs. It is therefore advantageous to fabricate JFETs using similar and compatible processing steps as those employed for the fabrication of MOSFETs to reduce integrated circuit fabrication costs.

BRIEF SUMMARY OF THE INVENTION

To provide further advances in the fabrication of JFETs having gate lengths precisely controlled through a deposited film thickness, an architecture is provided for fabricating vertical replacement gate (VRG) JFET devices.

According to one embodiment of the invention, a semiconductor device includes a first layer of semiconductor material and a first doped region formed therein. A second doped region of a different conductivity type than the first region is formed over the first region. A third doped region is formed over the second doped region, with a different conductivity type than the second doped region.

The first region is a source/drain region of a junction field-effect transistor, and the second doped region is the channel. The second source/drain region is formed over the channel and comprises the third doped region.

In an associated method of manufacture, an integrated circuit structure is fabricated by providing a semiconductor layer suitable for device formation and having a first surface formed along a first plane. For a JFET device, a first device region is formed in the semiconductor layer, wherein the device region is selected from among a source and a drain region. A gate region for the JFET is formed above the first device region. In fabricating the vertical JFET, the gate length is precisely controlled through the use of a sacrificial layer. Both JFETs and MOSFETs can be fabricated using the same basic fabrication process.

A JFET fabricated according to the teachings of the present invention provides a uniform depletion layer (or a uniform pinch-off condition) because the gate completely surrounds the channel and the channel is uniformly doped along a horizontal cross-section. In the prior art, the channel is oriented horizontally and the carriers flow horizontally through it. The channel is formed by diffusion into the semiconductor substrate and thus the upper channel region has a higher doping density then the lower region. As a result, the depletion layer is not uniform along any given vertical. Also, creating dual wells in a semiconductor substrate according to the present invention allows the fabrication of closely matched JFET pairs.

BRIEF DESCRIPTION OF THE DRAWINGS

The present invention can be more easily understood and the further advantages and uses thereof more readily apparent, when considered in view of the description of the preferred embodiments and the following figures in which.

In accordance with common practice, the various described features are not drawn to scale, but are drawn to emphasize specific features relevant to the invention. Reference characters denote like elements throughout the figures and text.

DESCRIPTION OF THE PREFERRED EMBODIMENTS

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated. The term "vertical transistor" means a transistor with individual semiconductor components vertically oriented with respect to the major surface so that the current flows vertically from source to drain. By way of example, for a vertical JFET the source, channel and drain regions are formed in relatively vertical alignment with respect to the major surface.

Figure 1A:
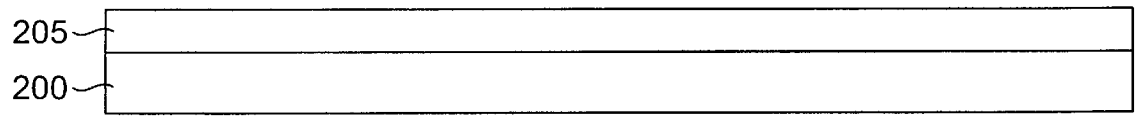
FIGS. 1A through 1R illustrate, in cross-section, a circuit structure according to one embodiment of the invention during sequential fabrication steps.
Figure 1B:
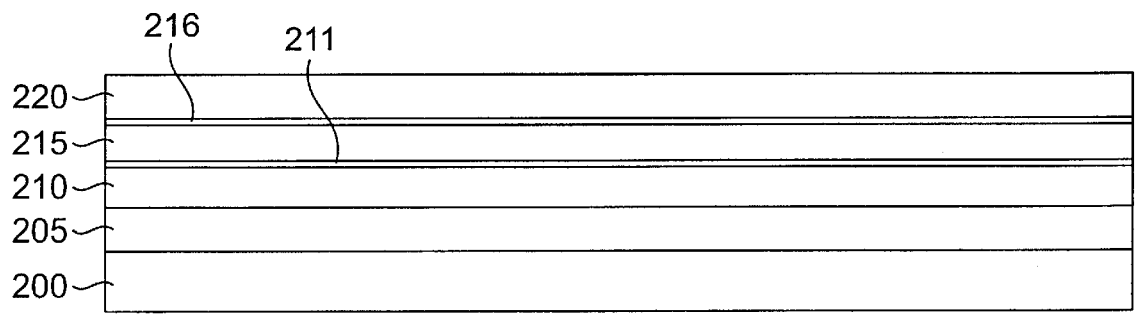
Figure 1C:
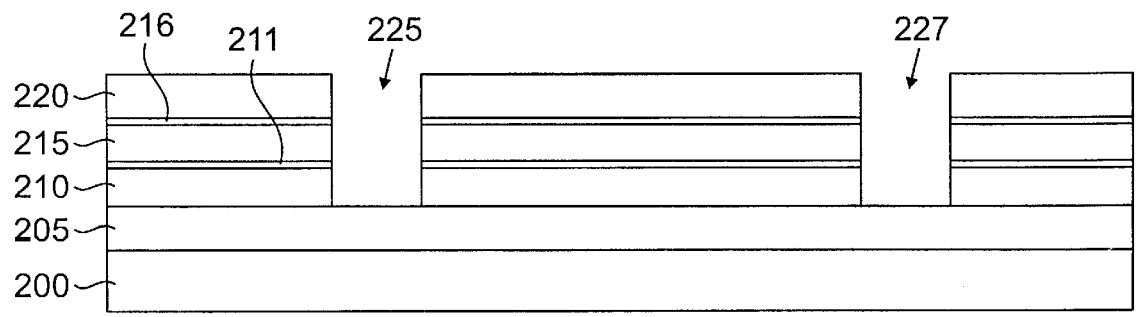
Figure 1D:
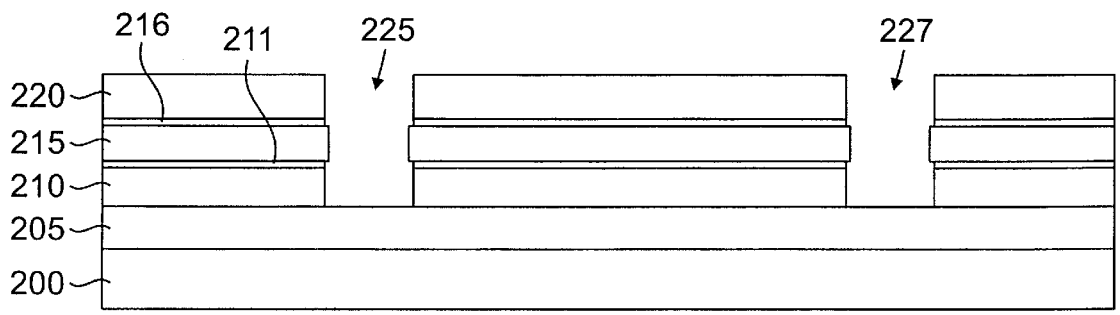
Figure 1E:
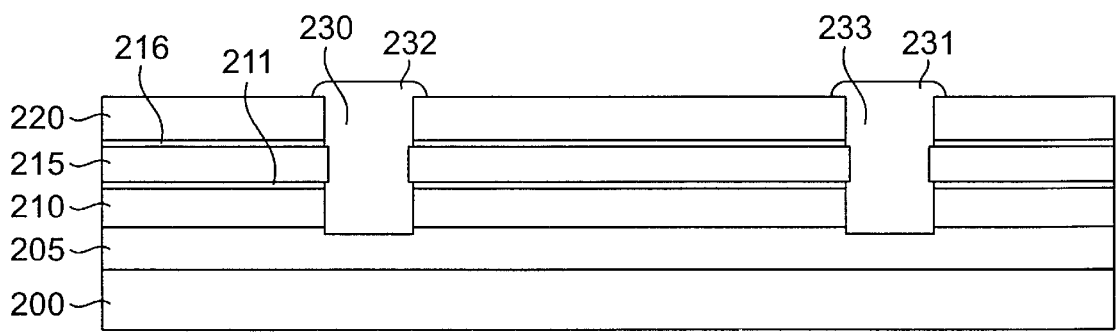
Figure 1F:
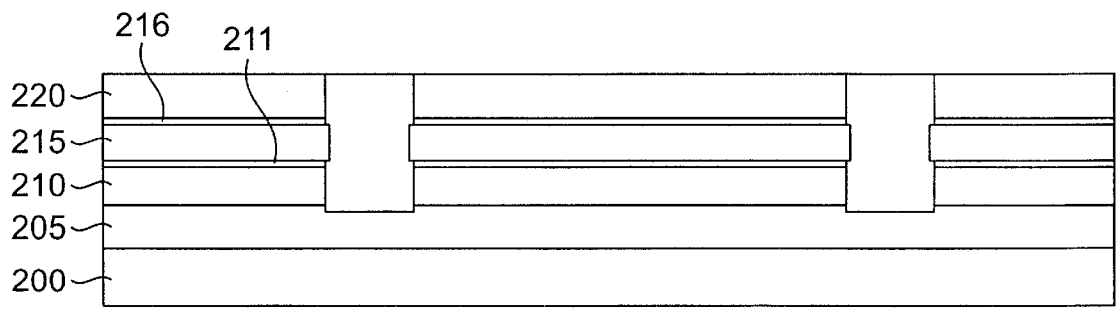
Figure 1G:
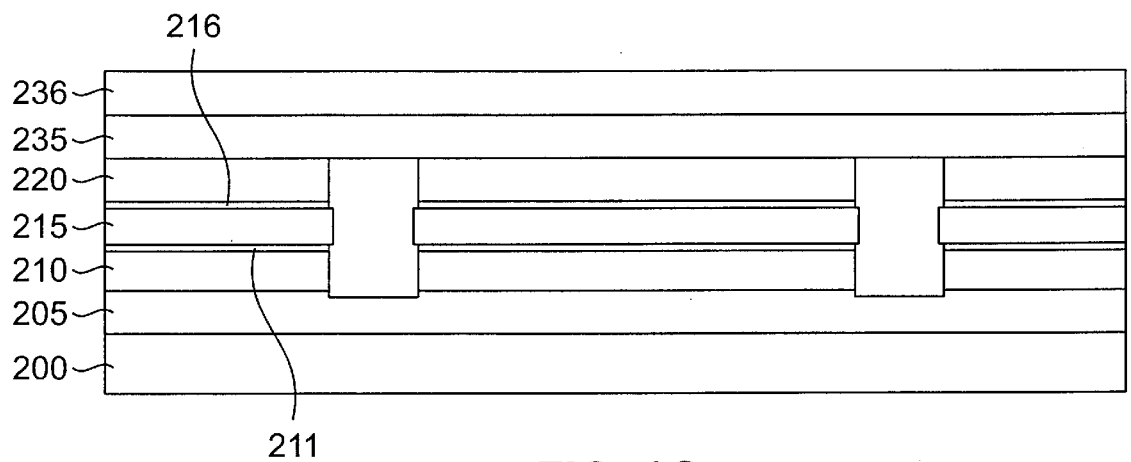
Figure 1H:
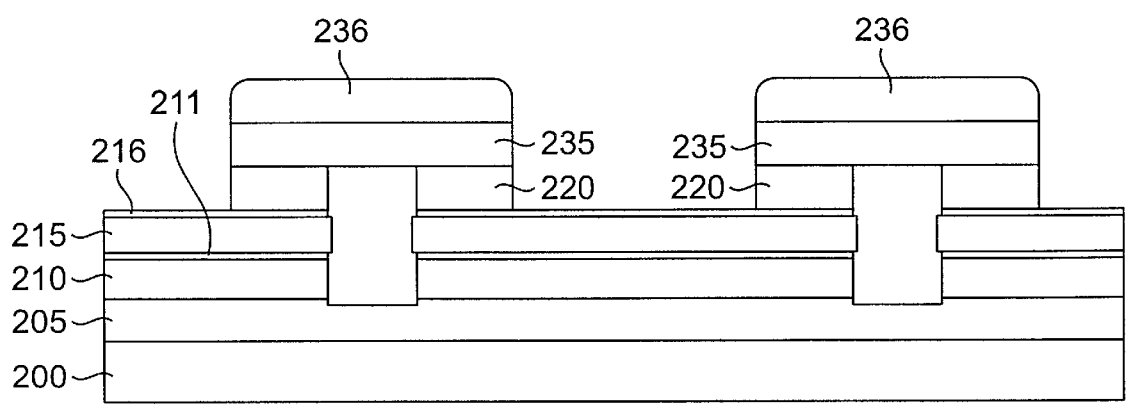
Figure 1I:
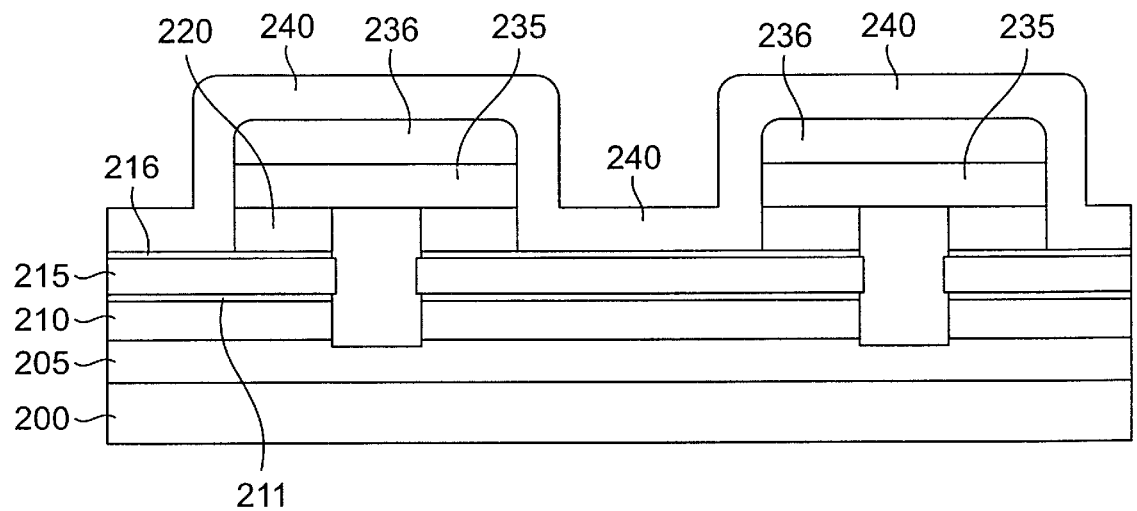
Figure 1J:
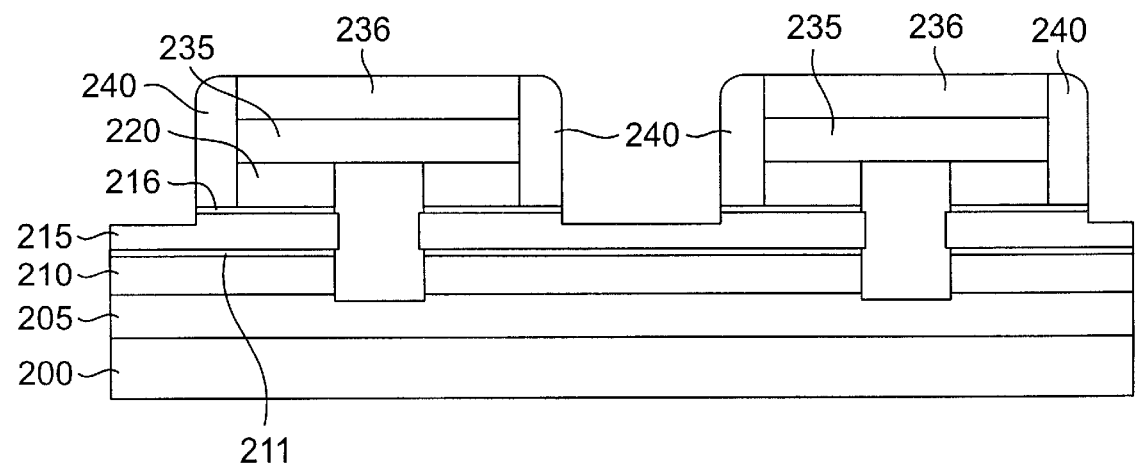
Figure 1K:
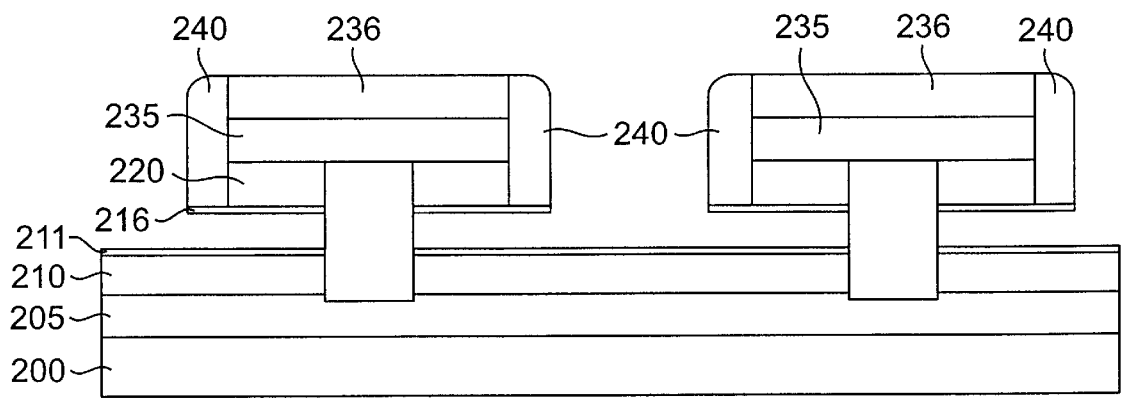
Figure 1L:
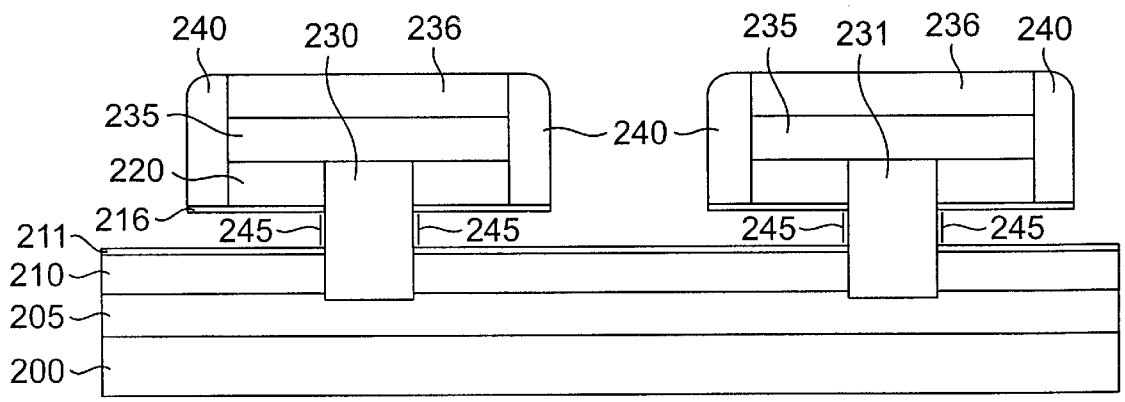
Figure 1M:
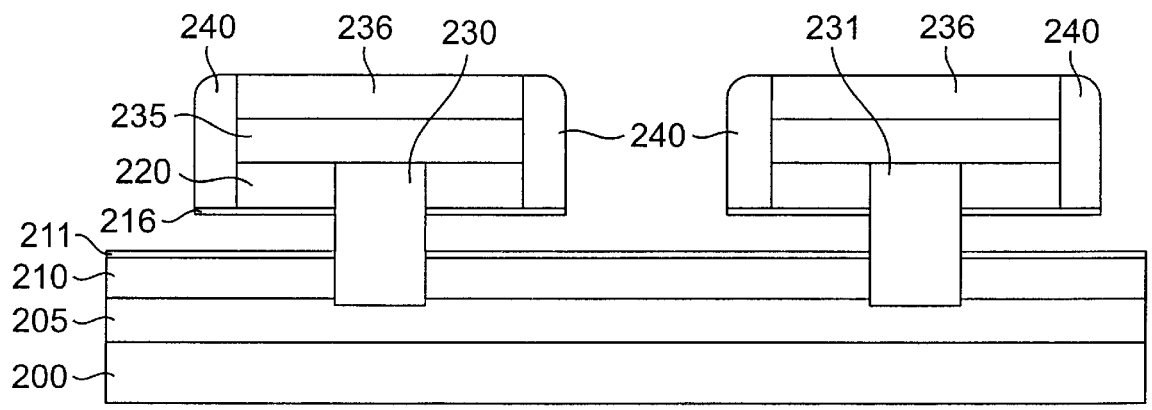
Figure 1N:
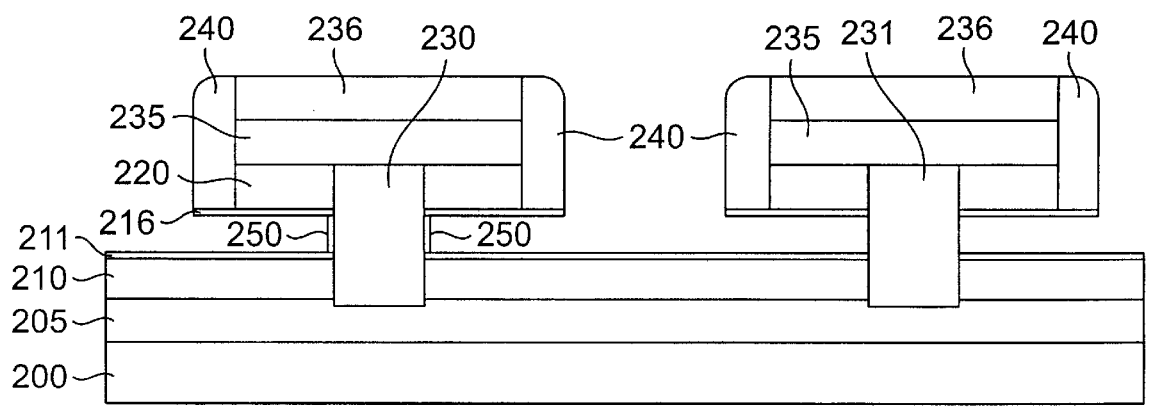
Figure 1O:
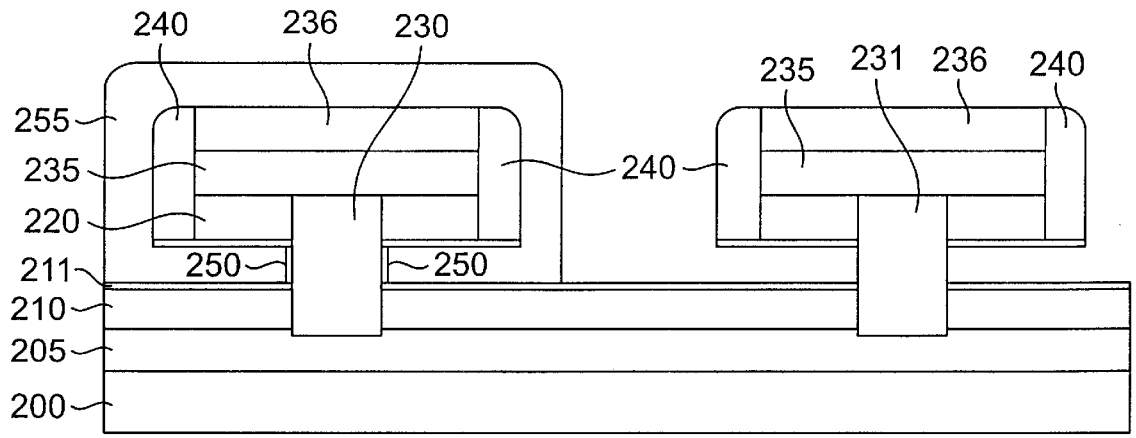
Figure 1P:
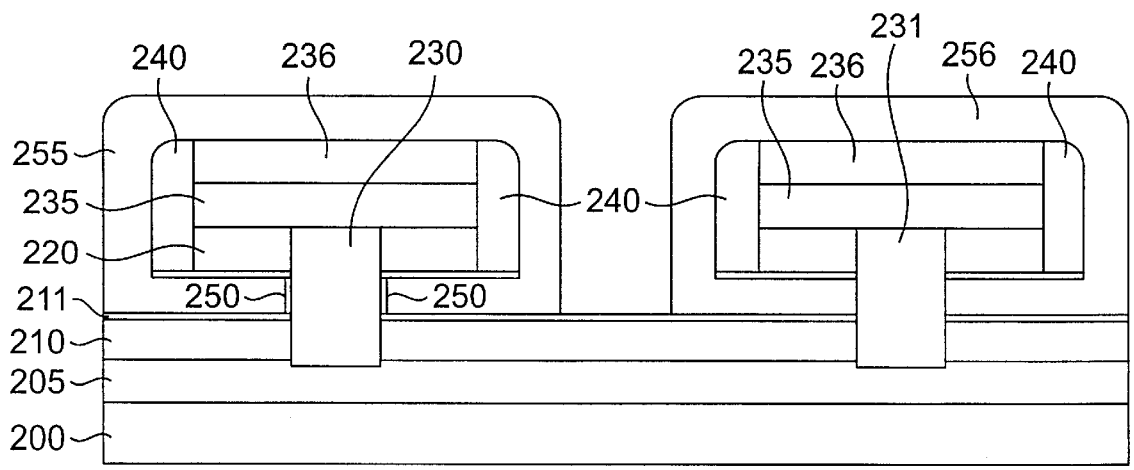
Figure 1Q:
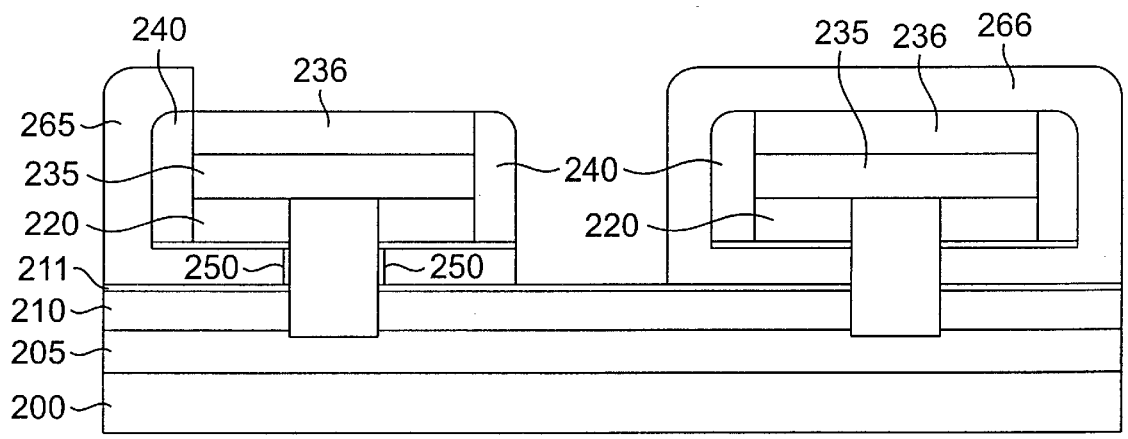
Figure 1R:
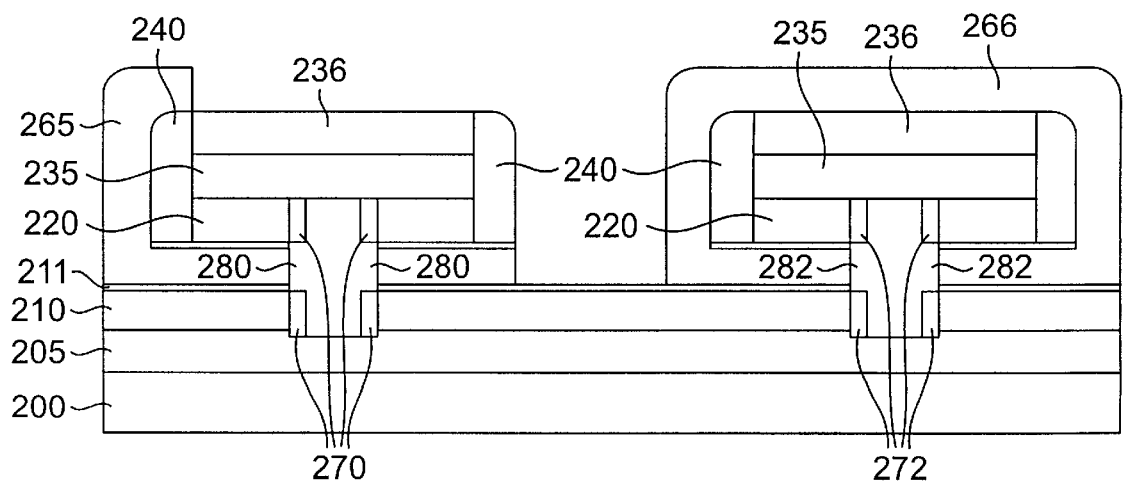

FIGS. 1A through 1R illustrate cross-sectional views of an integrated circuit structure 200 during various stages of fabrication to form an exemplary device according to the present invention. From the description, it will become apparent how a vertical replacement gate junction field-effect transistor can be fabricated, either independently or in conjunction with the fabrication of a vertical replacement gate metal-oxide-semiconductor field-effect transistor.

The fabrication process for forming both a VRG MOSFET and JFET is illustrated with reference to FIGS. 1A through 1R. The formation of both a VRG MOSFET and a VRG JFET are illustrated to demonstrate the compatibility of fabricating both device types in a single fabrication process. However, the invention is not limited to embodiments wherein a VRG MOSFET are a VRG JFET are fabricated in a side-by-side orientation or even in the same process. The various semiconductor features and regions described therein are preferably composed of silicon, but it known to those skilled in the art that other embodiments of the invention may be based on other semiconductor materials, including compound or heretojunction semiconductors alone or in combination.

Referring to FIG. 1A, a heavily doped source region 205 is formed in a silicon substrate 200, preferably a substrate having a <100> crystal orientation along an exposed major surface 203. In this illustration, of a vertical MOSFET and a vertical JFET, the source region of the device is formed in the silicon substrate and the drain region is formed atop a subsequently formed vertical channel, as will be discussed further. Alternatively, the drain region may be formed in the substrate with the source region formed atop the vertical channel. The former embodiment is the subject of this description. However, from this description, one skilled in the art can easily form a device in which the drain region is formed in the silicon substrate and the source region is formed overlying the subsequently formed vertical channel.

The depth of the heavily doped source region 205, the concentration of the dopant therein and the type of dopant (e.g., n-type or p-type) are all matters of design choice. An exemplary source region 205, wherein the dopant is phosphorous (P), arsenic (As), antimony (Sb) or boron (B) has a dopant concentration in the range of about $1\times10^{19}$ atoms/cm$^3$ to about $5\times10^{20}$ atoms/cm$^3$. A source region depth of about 200 nm is suitable. Preferably, the source region 205 is formed by a high dose ion implantation in the range of $1\times10^{14}$ to $1\times10^{16}$ atoms/cm$^2$ with an energy of 1 to 100 KeV. In FIG. 1B, multiple material layers are formed over the source region 205 in the silicon substrate 200. In one embodiment, five layers of material 210, 211, 215, 216 and 220 are formed over the source region 205 in the silicon substrate 200. The insulating layer 210 insulates the source region 205 from what will eventually be the overlying gate. Thus, the insulating layer 210 is composed of a material and has a thickness that is consistent with this insulating objective. Examples of suitable materials include doped silicon oxide. The use of doped insulating layer is advantageous because in certain embodiments, the insulating layer 210 serves as a dopant source, as will be explained further hereinbelow, to dope the subsequently formed source/drain extension regions in the vertical device channel. One example of a silicon oxide doping source is PSG (phosphosilicate glass, i.e., a phosphorous-doped silicon oxide) or BSG (boro-silicate glass, i.e., a boron-doped silicon oxide).

One skilled in the art is aware of suitable expedients for forming a layer of PSG or BSG on a substrate, e.g., plasma-enhanced chemical vapor deposition (PECVD). Suitable thicknesses for the insulating layer 210 are in the range of about 25 nm to about 250 nm. The insulating layer 210 contains a high concentration of dopant on the order of $1\times10^{21}$/cm$^3$.

An etch stop, as is known to those skilled in the art, is designed to prevent an etch from proceeding to an underlying or overlaying layer or layers. The etch stop therefore, has a significantly greater etch resistance to a selected etchant than the adjacent layer or layers to be etched. Specifically in this case, for the selected etchant, the etch rate of the etch stop layer 211 is much slower than the etch rate of the overlying layer, which, as will be discussed below, is a sacrificial layer. According to the present invention, for removal of a sacrificial layer of silicon oxide (e.g., silicon oxide formed from tetraethylene ortho silicate (TEOS)), an appropriate etch stop material limits action of the etchant on the underlying layer.

An etch stop layer 211 is formed over the insulating layer 210. Silicon nitride (Si$_3$N$_4$) is a suitable etch stop material. The thickness of the etch stop layer is dependent upon the resistance of the etch stop material to the selected etchant, relative to the material thickness to be removed through the etch process. In addition to preventing the etchant from acting on the underlying layer, the etch stop layer 211 also serves as a diffusion barrier to the dopants used to create the source/drain extensions, thereby defining the spacing and length of the source/drain extensions relative to the gate. The etch stop layer 211 has a thickness ranging between about 5 nm and about 50 nm.

A sacrificial layer 215 is formed (for example by a TEOS deposition process) over the etch stop layer 211. In subsequent processing, the sacrificial layer 215 is removed and the gate of the device formed in the space vacated by the sacrificial layer 215. Thus, the insulating material of the sacrificial layer 215 is chosen such that the etchant has a significantly higher selectivity to remove the sacrificial layer 215 relative to the etch stop layer 211. The thickness of the sacrificial layer 215 is selected to correspond to the channel length of the final device. Polycrystalline silicon is an example of a suitable semiconductor material for the sacrificial layer 215.

Preferably, the sacrificial layer 215 is deposited by decomposition of a tetraethyl orthosilicate precursor, or TEOS, Si(OC$_2$H$_5$)$_4$. Decomposition of vaporized liquid TEOS to form a silicon oxide film (referred to herein as a TEOS-deposited oxide) typically occurs by chemical vapor deposition (CVD) at 650° C. to 750° C. in an oxygen environment. Such TEOS depositions are known to provide good uniformity and step coverage when needed. Generally, the deposited film is understood to be a non-stoichiometric oxide of silicon, although it is often referred to as silicon dioxide. Inclusion of ozone (O$_3$), e.g., up to 10 percent of the reacting oxygen, facilitates lower temperature deposition. A typical reaction, which includes ozone, is performed at 400° C. and 300 Torr with 4 standard liters per minute (slm) oxygen, the oxygen comprising 6 percent ozone, 1.5 slm He and 300 standard cubic centimeters per minute (sccm) TEOS.

An etch stop layer 216 is also formed over the sacrificial layer 215. The etch stop layer 216 serves a similar function as the layer 211 and may, for example, be silicon nitride.

An insulating layer 220 is formed over the etch stop layer 216. Because it is advantageous that the insulating layer 220 have the same etch rate as the insulating layer 210 (for a common etchant), it is preferred that the insulating layers 210 and 220 be formed of the same material, e.g. PSG pr BSG, which may also serve as a dopant source.

All of the layers 210, 211, 215, 216 and 220 may be deposited using conventional chemical vapor deposition (CVD) process or other well-known deposition techniques. With regard to the aforedescribed sequence of layers, it should be noted that other embodiments may include significant variations, for example, fewer deposited layers. In any case, the resulting structure will be used to form two vertical channel regions, one for the MOSFET device and the other for the JFET device.

Referring to FIG. 1C, openings or windows 225 and 227 are anisotropically etched through the insulating layer 210, the etch stop layer 211, the sacrificial layer 215, the etch stop layer 216 and the insulating layer 220, downwardly to the source region 205 of the silicon substrate 200. The window diameter is determined by the performance characteristics and size constraints for the device under fabrication, and the limitations of the lithographic process utilized to form the window. The length of the windows 225 and 227 (also referred to as a trench), i.e., the length being orthogonal to both the horizontal and vertical dimensions in the FIG. 1C cross-section, is largely a matter of design choice and are not necessarily identical. For a given horizontal dimension, the current capacity of the doped region to be formed later in the windows 225 and 227 increases with increasing window length.

The windows 225 and 227 are then subjected to a chemical cleaning process, (e.g., RCA or piranha-clean) to clean the silicon at the bottom of the windows 225 and 227. As a result of this cleaning step, small portions of the insulating layers 210 and 220 forming a boundary with the windows 225 and 227 are removed. The indentations created are illustrated in FIG. 1D. As shown, the sacrificial layer 215 and the etch stop layers 211 and 216 extend beyond the edge of the insulating layers 210 and 220.

Referring to FIG. 1E, the windows 225 and 227 are filled with a device-quality crystalline semiconductor material (e.g., silicon) 230 and 231, respectively. Other examples of crystalline semiconductor materials that can be utilized include silicon-germanium and silicon-germanium-carbon. The windows 225 and 227 are formed in an undoped or lightly doped condition. Techniques for forming crystalline semiconductor material in windows are well known. For example, the crystalline semiconductor materials 230 and 231 can be grown epitaxially in the windows 225 and 227 using the source region 205 as a seed layer. In another embodiment, amorphous or polycrystalline silicon is deposited over the entire substrate 200 and all but the crystalline semiconductor material 230 and 231 in the windows 225 and 227 respectively, and top portions 232 and 233 thereof is removed. The amorphous semiconductor material is then annealed, e.g., with a laser, to re-crystallize it.

The crystalline semiconductor material 230 formed in the window 225 forms the channel of the MOSFET device. The crystalline semiconductor material 231 formed in the window 227 forms the channel of the JFET device. Therefore the crystalline semiconductor material 230 and 231 must be doped to form the channel as well as the source and drain extensions. Dopants of one type (i.e., n-type or p-type) are introduced into the crystalline semiconductor material 230 and 231 to form source and drain extensions, and dopants of the opposite conductivity type are introduced into the crystalline semiconductor materials 230 and 231 to form the channel. A variety of techniques to dope the crystalline semiconductor materials 230 and 231 as required are contemplated as suitable. In-situ doping of the crystalline semiconductor materials 230 and 231 during formation or implantation of dopants into the crystal and semiconductor materials 230 and 231 after formation are also suitable processes.

In situ dopant introduction, i.e., as a layer of material is formed via chemical vapor deposition, is well known and not described herein. Note, the dopants are introduced into the atmosphere at the appropriate point in the deposition process to produce the desired concentration as a function of layer depth. To form the source/drain extensions, dopants may be diffused out from the substrate 200 into the bottom of the crystalline semiconductor materials 230 and 231. Ion implantation is also a suitable expedient for creating the source/drain extension regions at the top of the crystalline semiconductor materials 230 and 231.

After the crystalline semiconductor materials 230 and 231 are doped and the dopants distributed therein in the desired manner, the integrated circuit structure 200 is not subjected to conditions that may significantly affect the distribution of the dopant in the crystalline semiconductor materials 230 and 231. Preferably, but not necessarily, after this step, the integrated circuit structure 200 is not exposed to temperatures that exceed 1100 degrees C. In fact, it is advantageous if the integrated circuit structure 200 is not exposed to temperatures in excess of 1000 degrees C. In certain embodiments, the substrate is not exposed to temperatures that exceed 900 degrees C. for prolonged periods of time (e.g. in excess of several minutes). However, the integrated circuit structure 200 can be subjected to rapid thermal annealing at temperatures of about 1000 degrees C. without adversely affecting the distribution of the dopants. Alternatively, subsequent high temperature processing may be designed to produce the desired dopant distributions.

After the windows 225 and 227 are filled and doped as discussed above, the top portions 231 and 232 are removed, for example, by chemical/mechanical polishing. The results of this process are illustrated in FIG. 1F.

As shown in FIG. 1G, a conformal drain layer 235 is formed over the insulating layer 220 and the top portions 231 and 232. The drain layer 235 provides a self-aligned top contact (the drain contact in this embodiment). One example of the suitable material for the drain layer 235 is doped polycrystalline silicon. The selected dopant is opposite in type to that used to dope the MOSFET and JFET channels. The concentration of the dopant is greater than about $1 \times 10^{20}$ atoms/cm$^3$.

As further illustrated in FIG. 1G, a conformal layer 236 is deposited over the drain layer 235. The material selected for the layer 236 is selected to have an etch rate that is significantly lower than the etch rate of the sacrificial layer 215. Preferably, the material selected for the layer 236 is the same as the material of the etch stop layers 211 and 216, but preferably is thicker than the layers 211 and 216. One example of a suitable material is silicon nitride. The layer 236 is formed over the drain layer 235 using known techniques.

Using conventional lithographic techniques, the drain layer 235, the layer 236 and the insulating layer 220 are patterned (using one or more dry etch steps) so that the only remaining portions are those either overlying or adjacent the crystalline semiconductor material 230 or 231. See FIG. 1H.

As illustrated in FIG. 1I, a conformal layer 240 is then deposited. For a given etch chemistry, the material for the layer 240 is selected to have an etch rate that is significantly lower than the etch rate of the sacrificial layer 215. One example of a suitable material for the layer 240 is silicon nitride. The thickness of the layer 240 is selected so that the remaining portions of the drain layer 235, the layer 236 and the insulating layer 220 are protected from contact with subsequent etchants.

The layer 240 is then etched using an anisotropic etch such as dry plasma etch, which also removes a portion of the etch stop layer 216. Therefore, as shown in FIG. 1J, the only portions of the layer 240 that remain after the anisotropic etch are sidewall portions laterally adjacent to the insulating layer 220 and the layers 235 and 236. As a result of this etch process, the sacrificial layer 215 is now exposed.

The device is then subjected to a wet etch (e.g., an aqueous hydrofluoric acid) or an isotropic dry etch (e.g., an anhydrous hydrofluoric acid) which removes the exposed remaining portion of the sacrificial layer 215. The result is illustrated in FIG. 1K, where the insulating layer 210 is still covered by the etch stop layer 211. The insulating layer 220 and the drain layer 235 are encapsulated by the remaining portion of the etch stop layer 216 and the layers 236 and 240. Consequently, the remaining portions of the insulating layers 210 and 220 and the drain layer 235 remain isolated from contact with subsequent etch expedients.

Referring to FIG. 1L, a sacrificial layer of thermal silicon dioxide 245 is grown on the exposed surface of the crystalline semiconductor material 230 and 231, to a thickness on the order of less than about 10 nm. The sacrificial silicon dioxide layer 245 is then removed (see FIG. 1M) using a conventional isotropic etch (e.g. an aqueous hydrofluoric acid). As a result of the formation and then the removal of the sacrificial silicon dioxide 245, the surface of each of the crystalline semiconductor materials 230 and 231 is smoother and some of the sidewall defects are removed. The etch stop layers 211 and 216 prevent the etch expedient used to remove the thermal silicon dioxide 245 from contacting the insulating layers 210 and 220 and the layer 235. This step is not necessarily required in device fabrication, but can be useful for improving the gate dielectric properties by, for example, reducing interface traps. The step may be omitted if the silicon defects are known not to be detrimental for the device being fabricated.

The exposed portion of the crystalline semiconductor material 230 defines the physical channel length of the MOSFET device that is being formed, and the exposed portion of the crystalline semiconductor material 231 defines the physical channel length of the JFET device that is being formed.

Next, a layer of gate dielectric 250 is formed on the exposed portion of the crystalline semiconductor materials 230 and 231. Suitable dielectric materials includes, for example, thermally-grown silicon dioxide, silicon oxynitride, silicon nitride or metal oxide. The thickness of the gate dielectric 250 is about 1 nm to about 20 nm. One example of a suitable thickness is 6 nm. In one embodiment, the silicon dioxide layer is grown by heating the integrated circuit structure 200 to a temperature in a range of about 700 degrees C. to about 1000 degrees C. in an oxygen-containing atmosphere. Other expedients for forming the gate dielectric 250 may include chemical vapor deposition, jet vapor deposition or atomic layer deposition, all of which are contemplated as suitable. Conditions for forming the gate dielectric 250 of the desired thickness are well known to those skilled in the art.

Since the gate dielectric 250 is not required for a JFET device, the gate dielectric in the MOSFET region is masked and a wet etch applied to the structure to remove the gate oxide 250 in the JFET region. FIG. 1N illustrates the device structure following this step.

Referring to FIG. 1O, in the MOSFET region, a gate electrode is formed surrounding the gate dielectric 250, by depositing a layer 255 of sufficiently conformal and suitable gate material. For example, a layer of doped amorphous silicon, in which the dopant is introduced in situ, is deposited and then crystallized to form doped polycrystalline silicon. This step must be accomplished using conditions that do not significantly affect the dopant profiles of the dopants in the crystalline semiconductor material 230. Other examples of suitable gate electrode materials include silicon-germanium and silicon-germanium-carbon. Metals and metal-containing compounds that have a suitably low resistivity and are compatible with the gate dielectric material and the other semiconductor processing steps, are also contemplated as suitable gate electrode materials. It is advantageous if the gate material has a work function near the middle of the band gap of the semiconductor plug material. Examples of such metals include titanium, titanium nitride, tungsten, tungsten silicide, tantalum, tantalum nitride and molybdenum. Suitable expedients for forming the gate electrode material include chemical vapor deposition, electroplating and combinations thereof.

It is known that the JFET requires a pn junction in the channel (i.e., the crystalline semiconductor material 231). One method for forming a region of opposite conductivity type to the channel is discussed below. With reference to FIG. 1P, in the JFET region, a gate electrode is formed surrounding the crystalline semiconductor material 231 by depositing a layer 256 of sufficiently conformal and suitable JFET gate material. For example, a layer of doped amorphous silicon, in which the dopant is introduced in situ, is deposited and then crystallized to form doped polysilicon crystalline. The dopant type of the layer 256 is opposite to the dopant conductivity of the semiconductor material 231.

In the embodiment where the JFET gate and MOSFET gate are formed in separate steps, the MOSFET gate material deposition step also deposits gate material in the JFET region. It is then necessary to etch the MOSFET gate material from the JFET region and then deposit JFET gate material. Finally, the JFET gate material is etched from the MOSFET region. Therefore, it is preferable to use the same material for both the layers 255 (the MOSFET gate material) and 256 (the JFET gate material). Thus, the layers can be formed simultaneously, eliminating the etching steps referred to above. In any case, when doped polysilicon is used for the JFET gate material, during the subsequent dopant drive-in thermal process, the polysilicon dopants are driven into the JFET channel (the crystalline semiconductor material 231) to form the PN junction required for the JFET device. The gate material can also be metal, creating a Schottky junction and the attendant depletion region when in contact with a semiconductor material.

Referring to FIG. 1Q, the layers 255 and 256 are patterned to form the gate 265 of the MOSFET device and the gate 266 of the JFET device. The gate configuration is largely a matter of design choice. The gates 265 and 266 surround the portion of the crystalline semiconductor material 230 and 231 forming the channels of the respective devices.

FIG. 1R shows the finished MOSFET and JFET device structures. Dopants are then driven into the crystalline semiconductor material 230 and 231 by solid phase diffusion from the insulating layers 210 and 220 to form source/drain extensions 270 of the MOSFET device and the source/drain extensions 272 of the JFET device. In solid phase diffusion, an oxide (e.g., silicon oxide). serves as the dopant source. At elevated temperatures, the dopant is driven from the doped oxide to the adjacent undoped (or lightly doped) regions of the crystalline semiconductor materials 230 and 231. This technique is advantageous because the doped area is defined by the interface between the crystalline semiconductor materials 230 andZ31 and the insulating layers 210 and 220 that serve as the dopant source, and allows the formation of self-aligned source/drain extensions (i.e. the source drain extensions are aligned with the gate). Examples of solid phase diffusion techniques are described in Ono, M., et al, "Sub-50 nm Gate Length N-MOSFETS with 10 nm Phosphorus Source and Drain Junctions," IEDM 93, pp. 119–122 (1993) and Saito, M., et al., "An SPDD D-MOSFET Structure Suitable for 0.1 and Sub0.1 Micron Channel Length and Its Electrical Characteristics," IEDM 92, pp. 897–900 (1992), which are hereby incorporated by reference.

The concentration of the dopant in source/drain extensions 270 and 272 is typically about at least $1 \times 10^{19}/cm^3$, with dopant concentrations of about $5 \times 10^{19}/cm^3$ contemplated as advantageous. With this solid phase diffusion technique, very shallow source and drain extensions are obtainable. The source/drain extensions 270 and 272 are shown as penetrating into the crystalline semiconductor material 230 and 231, respectively, preferably less than one half the width of the crystalline semiconductor material 230 and 231. Limiting the dopant penetrations in this manner avoids significant overlap in the doped regions from opposite sides of the crystalline semiconductor material 230 and 231. Also, the distance that the source/drain extensions 270 and 272 extend under the gate is preferably limited to less than one-fourth of the gate length. In the resulting structure, the net concentration of dopants in the source/drain extensions 270 and 272 are of the opposite type than that present in the now-formed channels 280 and 282 of the MOSFET and JFET respectively.

In yet another embodiment, a thin layer (e.g., a thickness of about 25 nm) of undoped silicon dioxide is formed over the source 205. Referring to FIG. 1E, this layer (not shown) acts as a barrier to undesirable solid phase diffusion from the insulating layer 210, (the dopant source), down through the source 205 and then up into the crystalline semiconductor materials 230 and 231.

In accordance with the teachings of the present invention, two closely-matched JFETs can be fabricated by sharing the same sacrificial layer. Since the sacrificial layer defines the gate length, the JFETs are closely matched if the source, drain and channel regions are similarly doped and the JFETs utilize the same gate electrode material. Also, the JFET channel is not lithographically controlled, therefore the channel length is not limited by lithographic process constraints. A JFET constructed according to the teachings of the present invention can be operated as a conventional JFET and as a voltage-controlled resistor.

An architecture and process have been described that is useful for forming junction field-effect transistors in a circuit structure. While specific applications of the invention have been illustrated, the principals disclosed herein provide a basis for practicing the invention in a variety of ways and a variety of circuit structures, including structures formed with Group III-IV compounds and other semiconductor materials. Although the exemplary embodiments pertain to voltage replacement gate JFETs, numerous variations are contemplated. Still other constructions not expressly identified herein do not depart from the scope of the invention, which is limited only by the claims that follow.

What is claimed is:

1. An integrated circuit structure comprising:
   a semiconductor substrate having a major surface formed along a plane;
   a first doped region formed in the surface;
   a second and a third doped region over said first doped region and of a different conductivity type than said first doped region;
   a fourth doped region over said second doped region and of a different conductivity type than said second doped region;
   a fifth doped region over said third doped region and of a different conductivity type than said third doped region;
   an oxide layer adjacent said second doped region;
   a first gate over said oxide layer; and
   a second gate over said third doped region, wherein said second gate is doped a different conductivity type than said third doped region.

2. The integrated circuit structure of claim 1 wherein the first doped region comprises a first source/drain region of a MOSFET, the second doped region comprises a channel region of said MOSFET, and the fourth doped region comprises a second source/drain region of said MOSFET.

3. The integrated circuit structure of claim 1 wherein the first doped region comprises a first source/drain region of a JFET, the third doped region comprises a channel region of said JFET and the fifth doped region comprises a second source/drain region of said JFET.

4. The integrated circuit structure of claim 1 wherein the second and the third doped regions are formed within a first and a second window, respectively, formed within the semiconductor substrate.

5. The integrated circuit structure of claim 1 wherein the oxide layer comprises a material selected from between silicon dioxide and silicon nitride.

6. The integrated circuit structure of claim 1 wherein the first and the second gate comprises a material selected from the group consisting of doped polysilicon crystalline, doped amorphous silicon, doped silicon-germanium, doped silicon-germanium-carbon, metals and metal compounds.

7. The integrated circuit structure of claim 6 wherein the metals and metal compounds are selected from the group consisting of titanium, titanium nitride, tungsten, tungsten suicide, tantalum, tantalum nitride, molybdenum, aluminum and copper.

8. An integrated circuit structure comprising first and second vertical field-effect transistors,
   wherein said first vertical field-effect transistor further comprises:
      a semiconductor substrate having a major surface formed along a plane;
      a first doped region formed in the surface;
      a second doped region over said first doped region and of a different conductivity type than said first doped region;
      a third doped region over said second doped region and of a different conductivity type than said second doped region;
      a dielectric layer adjacent said second doped region;
      a first gate over said dielectric layer;
   wherein said second vertical field-effect transistor further comprises:
      a fourth doped region formed in the surface;
      a fifth doped region over said fourth doped region and of a different conductivity type than said fourth doped region;

a sixth doped region over said fifth doped region and of a different conductivity type than said fifth doped region; and a second gate over said fifth doped region and of a different conductivity type than said fifth doped region.

9. The integrated circuit structure of claim 8 wherein the first doped region comprises a first source/drain region of a MOSFET, the second doped region comprises a channel region of said MOSFET, and the third doped region comprises a second source/drain region of said MOSFET.

10. The integrated circuit structure of claim 8 wherein the fourth doped region comprises a first source/drain region of a JFET, the fifth doped region comprises a channel region of said JFET, and the sixth doped region comprises a second source/drain region of said JFET.

11. The integrated circuit structure of claim 8 wherein the second and the fifth doped regions are formed within a first and a second window, respectively, formed within the semiconductor substrate.

12. The integrated circuit structure of claim 8 wherein the dielectric layer comprises a material selected from among silicon dioxide and silicon nitride.

13. The integrated circuit structure of claim 8 wherein the first and the second gate comprises a material selected from the group consisting of doped polysilicon crystalline, doped amorphous silicon, doped silicon-germanium, doped silicon-germanium-carbon, metals, and metal compounds.

14. The integrated circuit structure of claim 13 wherein the metals and metal compounds are selected from the group consisting of titanium, titanium nitride, tungsten, tungsten silicide, tantalum, tantalum nitride, molybdenum, aluminum and copper.

15. An integrated circuit structure comprising first and second vertical field-effect transistors, wherein said first vertical field-effect transistor further comprises:
a semiconductor substrate having a major surface formed along a plane;
a first doped region formed in the surface;
a second doped region over said first doped region and of a different conductivity type than said first doped region;
a third doped region over said second doped region and of a different conductivity type than said second doped region;
a first gate layer proximate said second doped region;

wherein said second vertical field-effect transistor further comprises:
a fourth doped region formed in the surface;
a fifth doped region over said fourth doped region and of a different conductivity type than said fourth doped region;
a sixth doped region over said fifth doped region and of a different conductivity type than said fifth doped region; and
a second gate layer over said fifth doped region and of a different conductivity type than said fifth doped region;

wherein said first gate layer is electrically isolated from said second doped region by a dielectric layer, and wherein said second gate layer is in direct contact with said fifth doped layer.

16. The integrated circuit structure of claim 15 wherein the first doped region comprises a first source/drain region of a MOSFET, the second doped region comprises a channel region of said MOSFET, and the third doped region comprises a second source/drain region of said MOSFET.

17. The integrated circuit structure of claim 15 wherein the fourth doped region comprises a first source/drain region of a JFET, the fifth doped region comprises a channel region of said JFET, and the sixth doped region comprises a second source/drain region of said JFET.

18. The integrated circuit structure of claim 15 wherein the second doped region forms a channel of the first vertical field-effect transistor, and wherein the fifth doped region forms a channel region of the second vertical field-effect transistor.

19. A junction field-effect transistor structure comprising:
a semiconductor substrate having a major surface formed along a plane;
a first doped region formed in the surface, wherein the first doped region is of a first conductivity type;
a second doped region formed over said first doped region and of a second conductivity type;
a third doped region over said second doped region and of a first conductivity type; and
a gate region of the first conductivity type disposed adjacent spaced-apart regions of said second doped region.

20. The junction field-effect transistor structure of claim 19 wherein the first doped region comprises a first source/drain region of a JFET, the second doped region comprises a channel region of said JFET, and the third doped region comprises a second source/drain region of said JFET.

21. An integrated circuit structure comprising:
a semiconductor substrate having a major surface formed along a plane;
a first doped region formed in the surface;
a first insulating layer over said first doped region;
a first etch stop layer over said first insulating layer;
a second insulating layer over said first etch stop layer;
a second etch stop layer over said second insulating layer;
a third insulating layer over said second etch stop layer;
a second doped region formed in a window extending from said third insulating region through said first insulating region, and wherein said second doped region is of a first conductivity type;
a third doped region over said second doped region, wherein said third doped region is of a second conductivity type;
a fourth doped region formed on an external surface of said second doped region, wherein said fourth doped region is of a second conductivity type.

* * * * *